United States Patent
Oe

(10) Patent No.: US 10,916,539 B2
(45) Date of Patent: Feb. 9, 2021

(54) SEMICONDUCTOR DEVICE HAVING A TRANSISTOR PORTION THAT INCLUDES AN OUTPUT RESISTIVE PORTION

(71) Applicant: FUJI ELECTRIC CO., LTD., Kanagawa (JP)

(72) Inventor: Takatoshi Oe, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/016,666

(22) Filed: Jun. 25, 2018

(65) Prior Publication Data

US 2019/0067273 A1 Feb. 28, 2019

(51) Int. Cl.
*H01L 27/02* (2006.01)
*H02H 9/04* (2006.01)

(52) U.S. Cl.
CPC ...... *H01L 27/0288* (2013.01); *H01L 27/0255* (2013.01); *H01L 27/0266* (2013.01); *H02H 9/046* (2013.01)

(58) Field of Classification Search
CPC ............. H01L 27/0288; H01L 27/0255; H01L 27/0266; H02H 9/046
USPC ........................................................ 257/360
See application file for complete search history.

(56) References Cited

U.S. PATENT DOCUMENTS

| 2011/0101425 A1* | 5/2011 | Grote | H01L 29/063 |
|---|---|---|---|
| | | | 257/288 |
| 2017/0194788 A1* | 7/2017 | Smith | H01L 27/0262 |

FOREIGN PATENT DOCUMENTS

| JP | 2012089616 A | 5/2012 |
|---|---|---|
| JP | 2017060032 A | 3/2017 |

* cited by examiner

*Primary Examiner* — Didarul A Mazumder

(57) ABSTRACT

Improving reliability of a semiconductor device including a transistor and resistance portion. Providing a semiconductor device including: a transistor including a gate portion and second conductivity type well layer, provided on a substrate having a first conductivity type drift region; a resistance portion provided close to a well layer of the transistor in the substrate; and two terminals connected to the resistance portion. The resistance portion is not of a second conductivity type region formed on the substrate. The semiconductor device further includes: an output transistor portion to switch whether or not the semiconductor device outputs current; a control transistor portion provided to a control protection circuit for controlling the output transistor portion; and a detection transistor portion to detect whether or not a power supply short-circuit is occurring to the semiconductor device. The transistor may be any of the output transistor portion, control transistor portion, or control transistor portion.

6 Claims, 11 Drawing Sheets

SEMICONDUCTOR DEVICE HAVING A TRANSISTOR PORTION THAT INCLUDES AN OUTPUT RESISTIVE PORTION

BACKGROUND

1. Technical Field

The present invention relates to a semiconductor device.

2. Related Art

Conventionally, a semiconductor device having a power supply short-circuit detecting function has been known (refer to Patent Document 1, for example).

Patent Document 1: Japanese Patent Application Publication No. 2017-60032.

A parasitic PNP transistor may operate and induce circuit malfunction in a conventional semiconductor device depends on its layout configuration. Therefore, it has been required to further improve reliability of a semiconductor device.

SUMMARY

The first aspect of the present invention provides a semiconductor device including: a transistor including a gate portion and a well layer of the second conductivity type, which is provided to a substrate having a drift region of the first conductivity type; a resistance portion provided close to the well layer of the transistor on the substrate; and two terminals connected to the resistance portion. The resistance portion may not be in a region of the second conductivity type formed on the substrate.

The semiconductor device may further include: an output transistor portion to switch whether or not the semiconductor device outputs current; a control transistor portion provided in a control protection circuit for controlling the output transistor portion; and a detection transistor portion to detect whether or not a power supply short-circuit has occurred to the semiconductor device. The transistor may be any of the output transistor portion, control transistor portion, or detection transistor portion.

The resistance portion may be connected to a gate terminal of the detection transistor portion.

As well as forming a second conductivity type channel, the detection transistor portion may have a source terminal connected to a power supply terminal of the semiconductor device, a gate terminal connected to an output terminal of the semiconductor device via a resistance portion, and a drain terminal connected to a ground terminal via resistance. The drain terminal may be connected to a power supply short-circuit terminal for outputting a power supply short-circuit detection signal that indicates a power supply short-circuit state of the semiconductor device.

The semiconductor device may further include a diode of which anode is connected to the gate terminal of the detection transistor portion, and which cathode is connected to the source terminal of the detection transistor portion. One end of the resistance portion may be connected to the anode, and the other end may be connected to the output terminal of the semiconductor device.

The resistance portion may have an insulating film provided on a substrate, and a polysilicon film formed on the insulating film and connected to the gate terminal of the detection transistor portion.

The gate portion may have a gate poly electrode formed of polysilicon. Dopant concentration of the polysilicon film of the resistance portion may be lower than dopant concentration of the gate poly electrode.

The semiconductor device may further include a second well layer of the second conductivity type provided on the substrate, and the resistance portion may have a diffusion resistance layer of the first conductivity type being surrounded by the second well layer and connected to the gate terminal of the detection transistor portion.

Doping concentration of the diffusion resistance layer may be thinner than doping concentration of the drift region.

Potential of the second well layer may be set equal to or less than power supply voltage that is set to the power supply terminal of the semiconductor device.

The output transistor portion, the control transistor portion, and the detection transistor portion of the semiconductor device may be formed on a single substrate.

Note that, the summary clause does not necessarily describe all necessary features of the embodiments of the present invention. The present invention may also be a sub-combination of the features described above.

DESCRIPTION OF EXEMPLARY EMBODIMENTS

Figure 1:
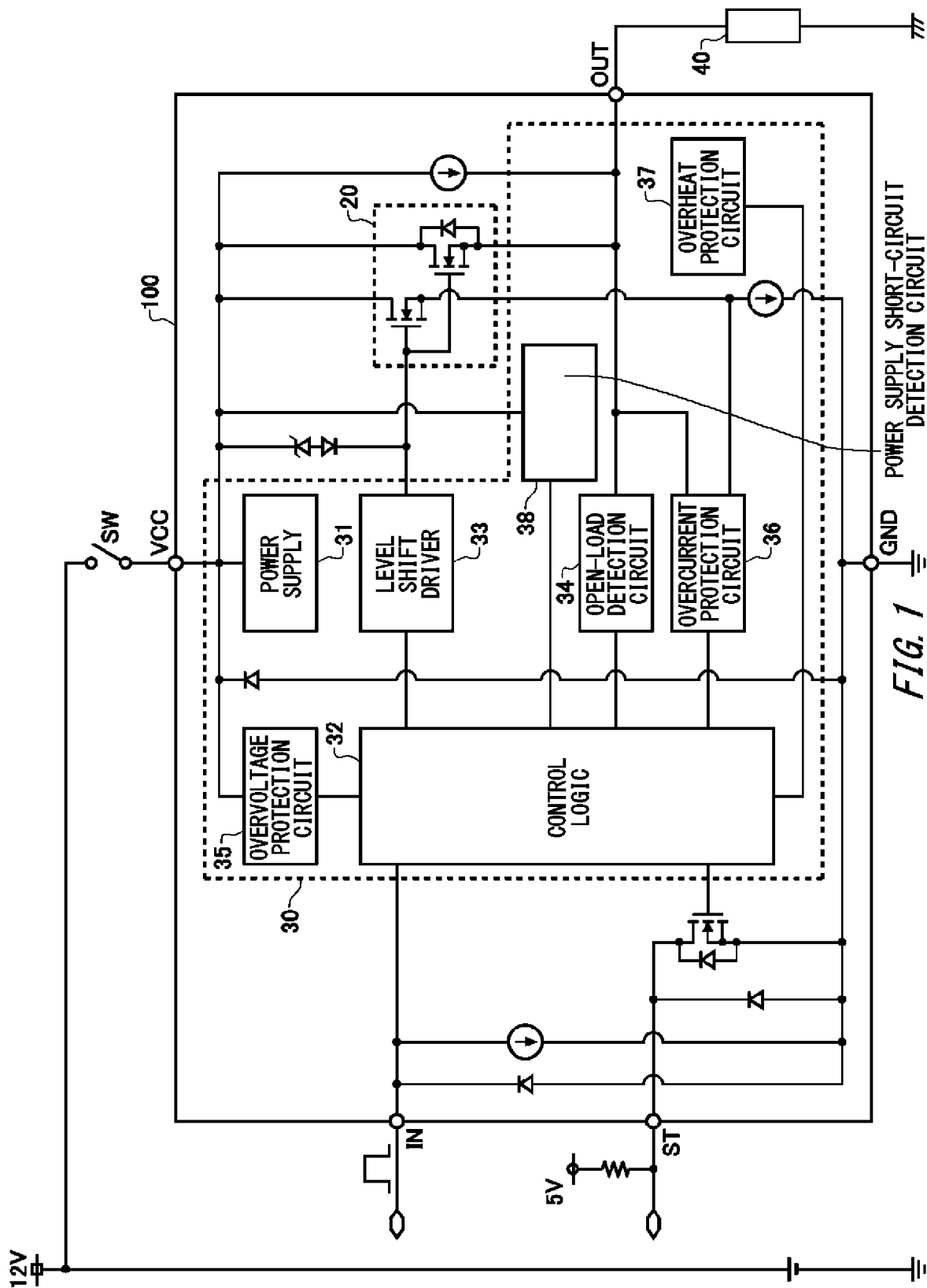
FIG. 1 illustrates an exemplary circuit diagram of a semiconductor device 100.

Hereinafter, the present invention is described with reference to embodiments. However, the following embodiments shall not limit the claimed invention that follows. Also, not all of the combinations of features described in the embodiments are necessarily essential to means provided by aspects of the invention.

Note that, in the present specification and the accompanying drawings, 'n' or 'p' to define a layer or region refers to a majority carrier thereof of electrons or holes respectively. Also, '+' or '−' to follow 'n' or 'p' indicates that a layer or region with '+' or '−' has higher impurity concentration or lower impurity concentration respectively, than a layer or region without '+' or '−'. Note that, in the following description of the embodiments and the accompanying drawings, the same reference numerals will be used for similar configurations so as to omit overlapping descriptions.

FIG. 1 illustrates an exemplary circuit diagram of a semiconductor device 100. The semiconductor device 100 includes an output transistor portion 20, a control protection circuit 30, and a load 40. The control protection circuit 30 includes a power supply 31, a control logic 32, a level shift driver 33, an open-load detection circuit 34, an overvoltage protection circuit 35, an overcurrent protection circuit 36, an overheat protection circuit 37, and a power supply short-circuit detection circuit 38. The semiconductor device 100 of the present example is a power IC having the output transistor portion 20 and the control protection circuit 30 in one-chip one-package configuration. Note that, a detection transistor portion 60 to be described below may also be added to the one-chip one-package configuration. The semiconductor device 100 of the present example is an IPS (Intelligent Power Switch), for example.

The output transistor portion 20 switches whether or not the semiconductor device 100 outputs current. That is, the output transistor portion 20 serves as a switch for conduction and non-conduction of current. In one example, the output transistor portion 20 has a power semiconductor such as a power MOSFET or an IGBT (Insulated Gate Bipolar Transistor). The output transistor portion 20, or the detection transistor portion 60 or a control transistor portion 70 to be described below is one example of a transistor in the semiconductor device 100.

The control protection circuit 30 has a control circuit and a protection circuit. The control circuit adjusts gate voltage of the output transistor portion 20 to control operation of the output transistor portion 20. The control circuit includes the power supply 31, control logic 32, and level shift driver 33. The control logic 32 operates on power supplied from the power supply 31. In one example, the control logic 32 controls gate voltage of the output transistor portion 20 via the level shift driver 33.

The protection circuit protects the output transistor portion 20 from overvoltage, large current, thermal disruption etc. The protection circuit includes the overvoltage protection circuit 35, overcurrent protection circuit 36, and overheat protection circuit 37.

The open-load detection circuit 34 detects whether or not the load 40 is connected to the output transistor portion 20. In one example, the open-load detection circuit 34 transmits to a microcomputer provided outside the semiconductor device 100 whether or not the load 40 is connected via a status terminal ST.

The overvoltage protection circuit 35 is a circuit to protect the output transistor portion 20 from overvoltage. The overvoltage protection circuit 35 is connected to a power supply terminal VCC of the semiconductor device 100.

The overcurrent protection circuit 36 is a circuit to protect the output transistor portion 20 from overcurrent. The overcurrent protection circuit 36 is connected to an output terminal OUT of the semiconductor device 100.

The overheat protection circuit 37 is a circuit to protect the output transistor portion 20 from overheat. The overheat protection circuit 37 measures temperature of the output transistor portion 20, and if the temperature becomes equal to or higher than preset temperature, it transmits to the control logic 32 that the output transistor portion 20 is in an overheat state.

The power supply short-circuit detection circuit 38 is a circuit to detect a power supply short-circuit state of the semiconductor device 100 at the time of the power supply short-circuit. A power supply short-circuit is a state in which the output terminal OUT is short-circuited with high voltage equal to or higher than power supply voltage $V_{CC}$ of the semiconductor device 100. For example, the power supply short-circuit detection circuit 38 communicates whether or not the power supply short-circuit is detected to the microcomputer.

The semiconductor device 100 has the power supply terminal VCC, a ground terminal GND, an input terminal IN, the status terminal ST, and the output terminal OUT. The power supply terminal VCC is connected to a power supply unit such as a battery via an ignition switch SW. Although the present example shows a case in which a battery voltage is 12 V, a battery voltage is not limited to this.

The ground terminal GND is connected to the ground potential. The input terminal IN is connected to an input command terminal of the microcomputer so as to receive an input signal from the microcomputer. For example, the input terminal IN receives an on-off command signal for the output transistor portion 20 from the microcomputer. The status terminal ST is connected to a diagnostic terminal of the microcomputer so as to transmit condition of the output transistor portion 20 and load 40 to the microcomputer. The output terminal OUT is connected to the load 40 and conducted if the output transistor portion 20 is turned on.

Figure 2:
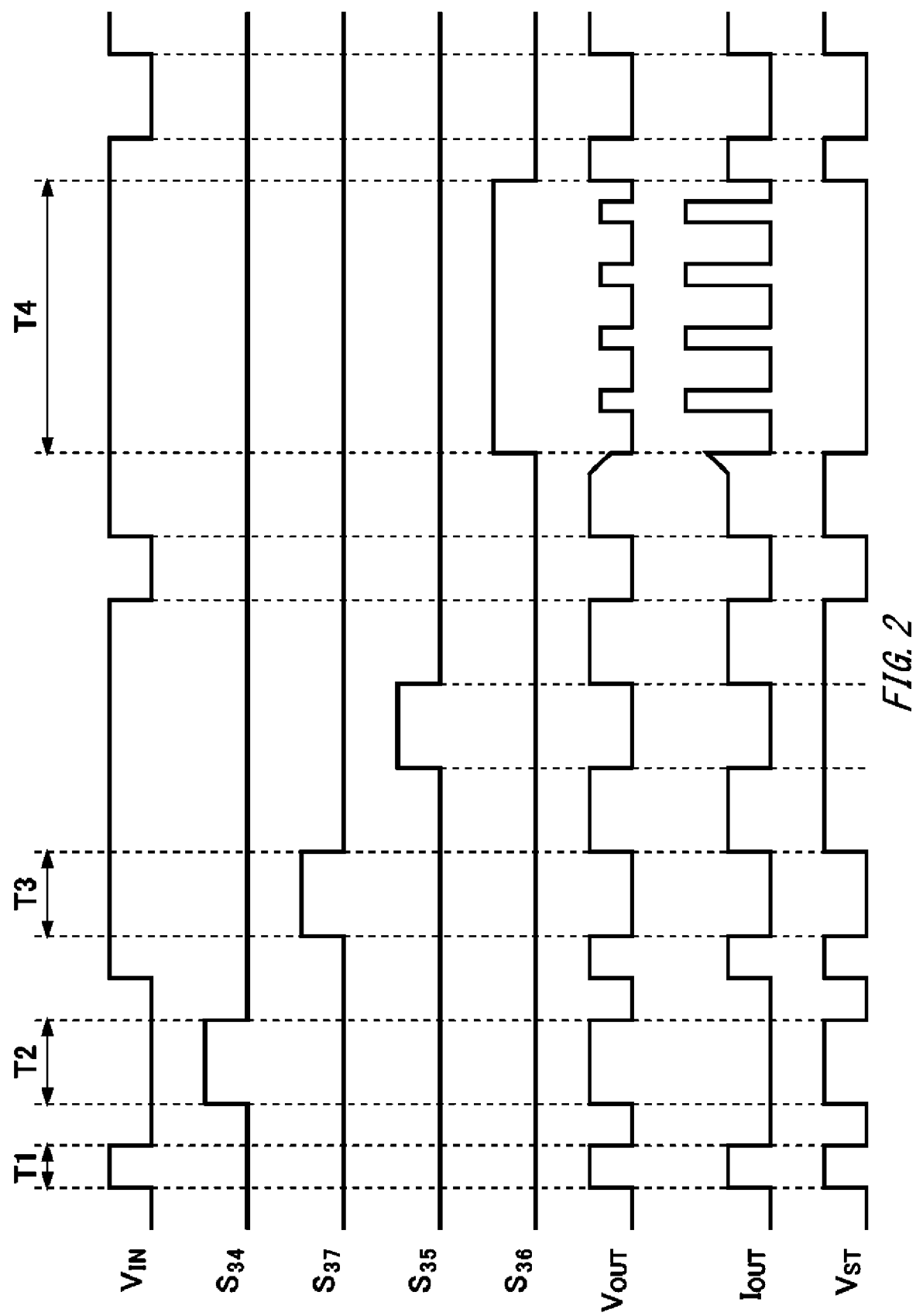
FIG. 2 illustrates an exemplary timing chart of the semiconductor device 100.

FIG. 2 illustrates an exemplary timing chart of the semiconductor device 100. $V_{IN}$ is input voltage that is input to the input terminal IN. For example, if the input voltage $V_{IN}$ is Hi, the output transistor portion 20 is turned on, and if the input voltage $V_{IN}$ is Lo, the output transistor portion 20 is turned off.

An output signal $S_{34}$ is an output signal of the open-load detection circuit 34. If the output signal $S_{34}$ is Hi, it indicates that the load 40 is open.

An output signal $S_{35}$ is an output signal of the overvoltage protection circuit 35. If the output signal $S_{35}$ is Hi, it indicates that the overvoltage protection circuit 35 is in an overvoltage state.

An output signal $S_{36}$ is an output signal of the overcurrent protection circuit 36. If the output signal $S_{36}$ is Hi, it indicates that the overcurrent protection circuit 36 is in an overcurrent state.

An output signal $S_{37}$ is an output signal of the overheat protection circuit 37. If the output signal $S_{37}$ is Hi, it indicates that the overheat protection circuit 37 is in an overheat state.

Output voltage $V_{OUT}$ indicates voltage of the output terminal OUT. Output current $I_{OUT}$ indicates current that is output from the output terminal OUT by the semiconductor device 100.

Status voltage $V_{ST}$ indicates voltage that is output from the status terminal ST. In a Hi state of the input voltage $V_{IN}$, if the status voltage $V_{ST}$ is Hi, it indicates that the output transistor portion 20 and load 40 are in normal operation.

In a Hi state of the input voltage $V_{IN}$, if the overvoltage protection circuit 35, overcurrent protection circuit 36, and overheat protection circuit 37 do not operate (Period T1, for example), the output current $I_{OUT}$ flows through the load 40. 'The overvoltage protection circuit 35, overcurrent protection circuit 36, and overheat protection circuit 37 do not operate' means the output signal $S_{35}$ to output signal $S_{37}$ are in Lo states. In addition, the semiconductor device 100 outputs Hi as the status voltage $V_{ST}$ to the microcomputer.

In a Lo state of the input voltage $V_{IN}$, if the open-load detection circuit 34 is operating (Period T2, for example), the output current $I_{OUT}$ does not flow through the load 40 because the load 40 is open. 'The open-load detection circuit 34 is operating' means the output signal $S_{34}$ is in a Hi state. In addition, the semiconductor device 100 outputs Hi as the status voltage $V_{ST}$ to the microcomputer.

In a Hi state of the input voltage $V_{IN}$, if the overheat protection circuit 37 is operating (Period T3, for example), the output current $I_{OUT}$ to flow through the load 40 is blocked to protect the output transistor portion 20. 'The overheat protection circuit 37 is operating' means the output signal $S_{37}$ is in a Hi state. In addition, the semiconductor device 100 outputs Lo as the status voltage $V_{ST}$ to the microcomputer.

In a Hi state of the input voltage $V_{IN}$, if the overcurrent protection circuit 36 is operating (Period T4, for example), the output current $I_{OUT}$ to flow through the load 40 is oscillated to protect the output transistor portion 20. 'The overcurrent protection circuit 36 is operating' means the output signal $S_{36}$ is in a Hi state. In addition, the semiconductor device 100 outputs Lo as the status voltage $V_{ST}$ to the microcomputer.

Table 1 shows a truth table of the output transistor portion 20. Whether or not the output transistor portion 20 is in a normal state is identified based on the combination of the input voltage $V_{IN}$, status voltage $V_{ST}$, and output voltage $V_{OUT}$. Also, if the output transistor portion 20 is in an abnormal state, it is detected that what kind of abnormality is found, based on the combination of the input voltage $V_{IN}$, status voltage $V_{ST}$, and output voltage $V_{OUT}$.

TABLE 1

| | INPUT VOLTAGE $V_{IN}$ | STATUS VOLTAGE $V_{ST}$ | OUTPUT VOLTAGE $V_{OUT}$ | NOTES |
|---|---|---|---|---|
| NORMAL OPARATION | L | L | L | — |
| | H | H | H | |
| OPEN-LOAD | OPEN | L | L | |
| | L | H | H | SELF-RESET |
| OVER-CURRENT | L | L | L | OSCILLATION-MODE |
| | H | L | L | SELF-RESET |
| OVERHEAT | L | L | L | SELF-RESET |
| | H | L | L | |
| OVER-VOLTAGE | L | L | L | SELF-RESET |
| | H | H | L | |

Figure 3:
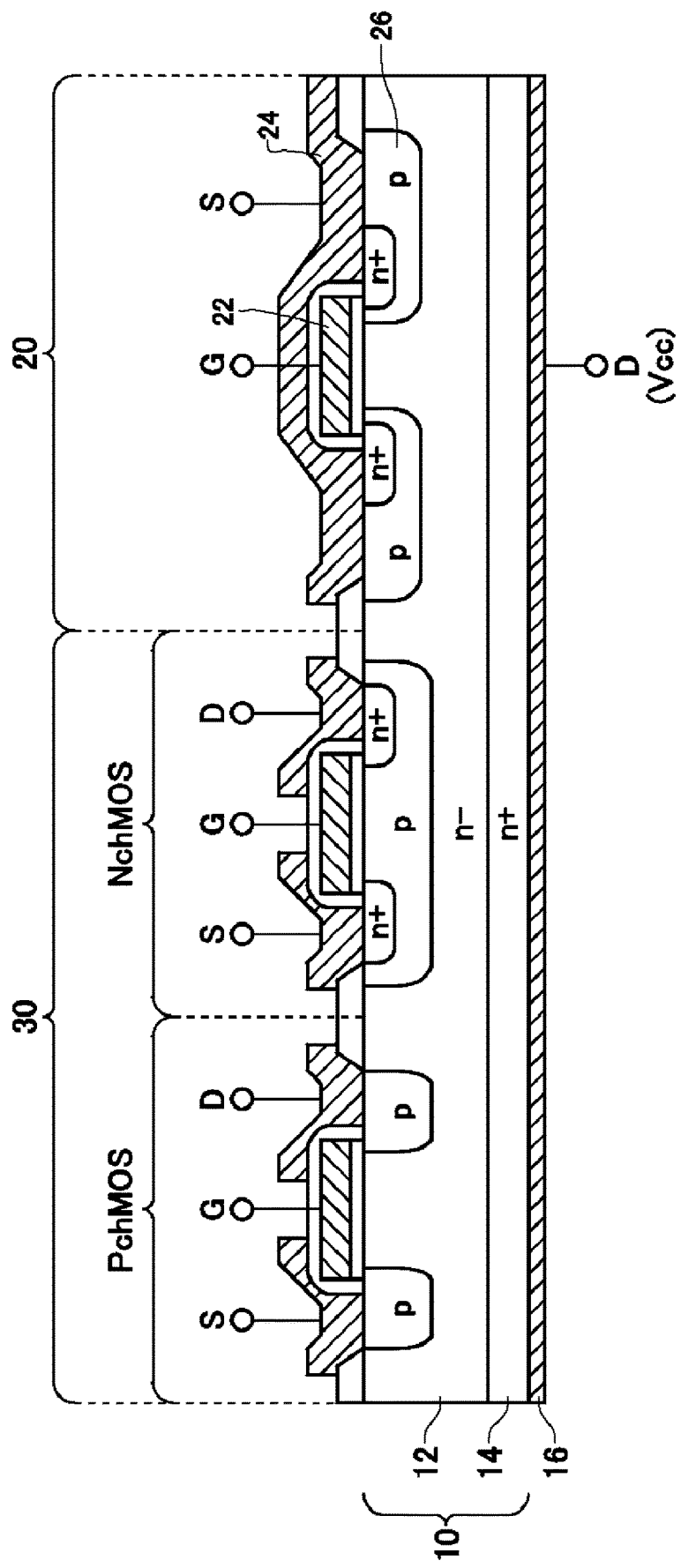
FIG. 3 illustrates an exemplary cross-sectional structure of the semiconductor device 100.

FIG. 3 illustrates an exemplary cross-sectional structure of the semiconductor device 100. The semiconductor device 100 has a drift region 12 and buffer region 14 of the first conductivity types, which are formed on a substrate 10. Note that, in the present specification, although the first conductivity type and the second conductivity type are described as n type and p type respectively, each of them may be switched to the opposite conductivity types.

The output transistor portion 20 and control protection circuit 30 are formed on a single substrate 10. Thereby, miniaturization of the semiconductor device 100 is realized. For example, in a progressing field of automobiles having electric controls, it allows to mount numerous electric control parts in a limited space. However, since the output transistor portion 20 and control protection circuit 30 will be placed close to each other by integrating the output transistor portion 20 and control protection circuit 30 on a single substrate, the layout configuration may be limited.

In the present example, the output transistor portion 20 is configured by an NchMOS transistor. Note that, a PchMOS transistor may also be used for the output transistor portion 20. The output transistor portion 20 has a gate electrode 22, a source electrode 24, and a drain electrode 16. Also, the output transistor portion 20 has well layers 26 which are provided to the substrate 10 and connected to the source electrode 24. The well layers 26 of the present example are of the second conductivity type.

The control protection circuit 30 of the present example has an NchMOS transistor which is a control transistor portion 70 and a PchMOS transistor. An n− type drift region 12 and n+ type buffer region 14 are formed on the substrate 10. The PchMOS transistor is formed in the n− type drift region 12. The NchMOS transistor is formed within a P well that is formed in the n− type drift region 12. A drain electrode 16 is formed on the back surface of the buffer region 14.

Figure 4:
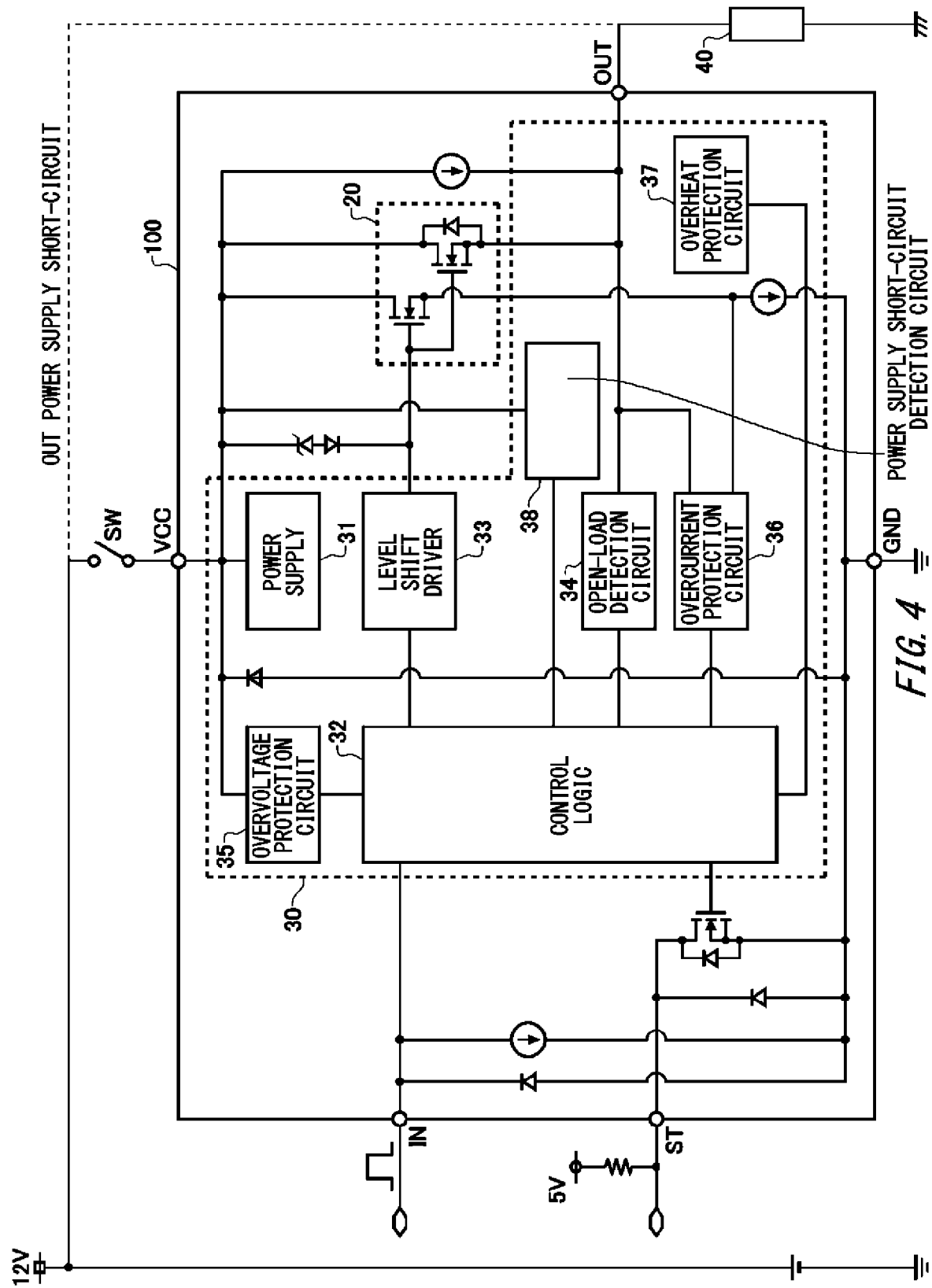
FIG. 4 illustrates an exemplary circuit diagram of the semiconductor device 100 at the time of a power supply short-circuit.

FIG. 4 illustrates an exemplary circuit diagram of the semiconductor device 100 at the time of a power supply short-circuit. In the present example, the output terminal OUT is connected to the battery terminal at the time of the power supply short-circuit. Accordingly, voltage of the output terminal OUT is set to the battery voltage, and the output voltage $V_{OUT}$ becomes 12 V. On the other hand, since the power supply terminal VCC is connected to the battery via the ignition switch SW, the power supply voltage $V_{CC}$ having the battery voltage is reduced by voltage drop $V_{SW}$ of the ignition switch SW. If the voltage drop $V_{SW}$ is 0.8 V, the power supply voltage $V_{CC}$ is 11.2 V (=12 V−0.8 V).

Here, if a power supply short-circuit occurs to the semiconductor device 100, current flows between a resistance portion 51 that is formed of a p well and the ground terminal GND that is connected to the NchMOS transistor in the present example, due to a parasitic PNP transistor being operated. The flow of current is deemed the same as the NchMOS transistor being turned on, and malfunction may be caused to the semiconductor device 100, as described below with reference to FIG. 10. The power supply short-circuit detection circuit 38 detects whether or not the power supply short-circuit is occurring to the semiconductor device 100.

Figure 5:
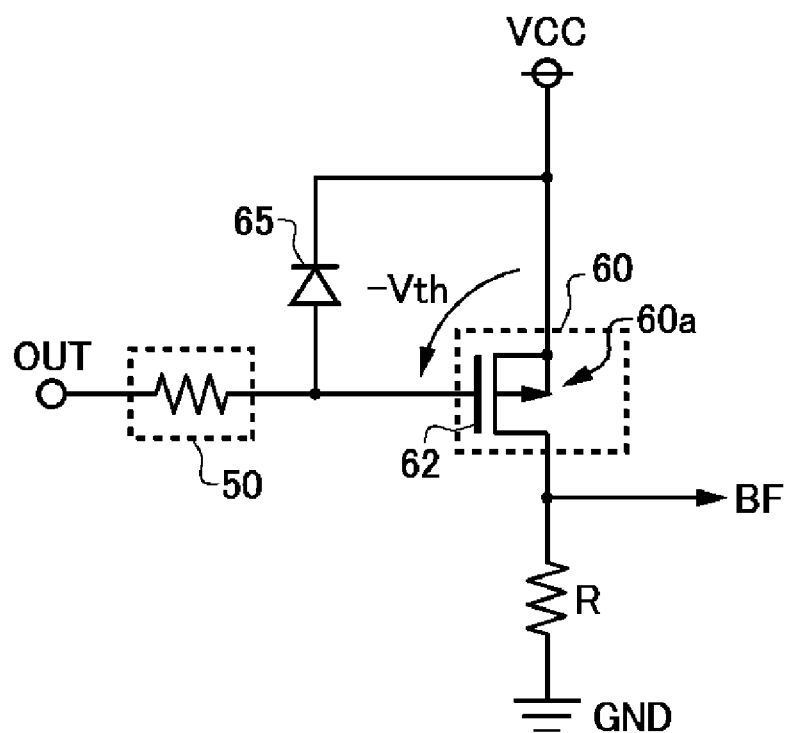
FIG. 5 illustrates an exemplary configuration of a power supply short-circuit detection circuit 38.

FIG. 5 illustrates an exemplary configuration of the power supply short-circuit detection circuit 38. The power supply short-circuit detection circuit 38 includes a resistance portion 50, a detection transistor portion 60, and a diode 65.

The detection transistor portion 60 detects whether or not a power supply short-circuit is occurring to the semiconductor device 100. The semiconductor device 100 of the present example includes a detection main transistor 60a as the detection transistor portion 60. The detection main transistor 60a has a gate terminal that is connected to the output terminal OUT of the semiconductor device 100 via the resistance portion 50. The gate terminal is connected to a gate electrode 62. The detection main transistor 60a is a transistor portion to form a second conductivity type channel, and is the PchMOS transistor in the present example. The detection main transistor 60a has a source terminal connected to the power supply terminal VCC of the semiconductor device 100. The detection main transistor 60a has a drain terminal that is connected to a ground terminal GND via resistance R. The drain terminal of the detection main transistor 60a is connected to a power supply short-circuit terminal for outputting a power supply short-circuit signal BF to indicate a power supply short-circuit state of the semiconductor device 100. The resistance R has a predetermined resistance value to output the power supply short-circuit signal BF.

The diode 65 is provided between the gate and source of the detection main transistor 60a. An anode terminal of the diode 65 is connected to the gate terminal of the detection main transistor 60a. A cathode terminal of the diode 65 is connected to the source terminal of the detection main transistor 60a. The diode 65 of the present example serves as a gate protection Zener diode. That is, the diode 65 prevents a gate oxide of the detection main transistor 60a from having a dielectric breakdown caused by a potential difference generated between the power supply terminal VCC and the output terminal OUT.

The resistance portion 50 is provided between the anode terminal of the diode 65 and the output terminal OUT. The resistance portion 50 is connected to at least two terminals. One end of the resistance portion 50 of the present example is connected to the anode terminal of the diode 65, and the other end is connected to the output terminal OUT of the output transistor portion 20. Thereby, if the diode 65 breaks down, the resistance portion 50 prevents the diode 65 from being broken by current. The resistance portion 50 of the present example is provided close to the well layer of the transistor portion in the substrate 10. Hereinafter, a case in which it is provided close to the well layer 74 of the control transistor portion 70 (to be described below) will be particularly described.

Here, in normal operation with no power supply short-circuit occurring, if the input voltage $V_{IN}$=Lo, the output transistor portion 20 is turned off, and the output voltage $V_{OUT}$ indicates approximately the GND potential. In this case, because a potential difference equal to or greater than threshold voltage Vth of the detection main transistor 60a is generated between the power supply terminal VCC and the output terminal OUT, the detection main transistor 60a is turned on. If the detection main transistor 60a is turned on, the power supply short-circuit detection circuit 38 outputs Hi as a power supply short-circuit signal BF.

At the time of a power supply short-circuit, since the output transistor portion 20 is not turned on if the input voltage $V_{IN}$=Lo, the output voltage $V_{OUT}$ indicates approximately a battery potential. In this case, because a potential difference equal to or greater than threshold voltage Vth of the detection main transistor 60a is not generated between the power supply terminal VCC and output terminal OUT, the detection main transistor 60a is turned off. If the detection main transistor 60a is turned off, the power supply short-circuit detection circuit 38 outputs Lo as a power supply short-circuit signal BF.

As described above, the semiconductor device 100 outputs Hi as a power supply short-circuit signal BF in normal operation, and outputs Lo as a power supply short-circuit signal BF at the time of a power supply short-circuit. Accordingly, a power supply short-circuit state can be detected by a signal that is output by the semiconductor device 100.

Figure 6:
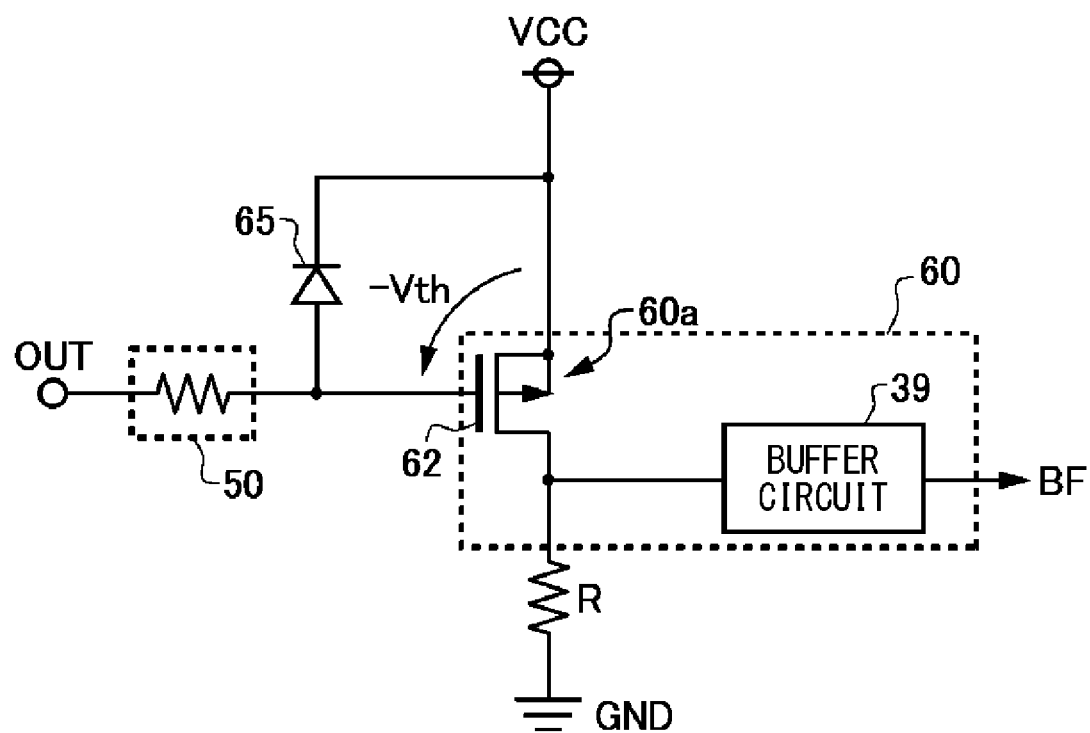
FIG. 6 illustrates an exemplary configuration of the power supply short-circuit detection circuit 38.

FIG. 6 illustrates an exemplary configuration of the power supply short-circuit detection circuit 38. A power supply short-circuit detection circuit 38 includes a buffer circuit 39, a resistance portion 50, a detection main transistor 60a, and a diode 65. The power supply short-circuit detection circuit 38 of the present example is different from the power supply short-circuit detection circuit 38 of FIG. 5, in that it includes a buffer circuit 39.

The buffer circuit 39 shapes signal waveform of a power supply short-circuit signal BF that is output by the power supply short-circuit detection circuit 38. The buffer circuit 39 outputs a shaped power supply short-circuit signal BF. The buffer circuit 39 is connected to a terminal between the drain terminal of the detection main transistor 60a and the resistance R. The buffer circuit 39 of the present example includes an NchMOS transistor. Because a parasitic PNP transistor is not likely to operate in the structure of the semiconductor device 100, the NchMOS transistor of the buffer circuit 39 may be arranged adjacent to the resistance portion 50.

Figure 7A:
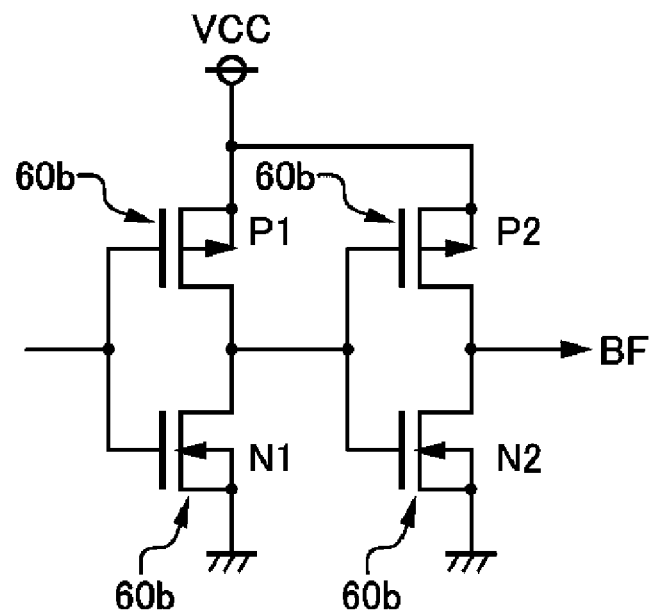
FIG. 7A illustrates an exemplary configuration of the buffer circuit 39.

FIG. 7A illustrates an exemplary configuration of the buffer circuit 39. The buffer circuit 39 of the present example includes four detection buffer transistors 60b. The buffer circuit 39 of the present example includes two PchMOS transistors P1 and P2, and two NchMOS transistors N1 and N2, as the detection buffer transistors 60b. The detection buffer transistor 60b is one example of the detection transistor portion 60.

The PchMOS transistor P1 and NchMOS transistor N1 are connected in series between the power supply terminal VCC and ground terminal GND. Also, the PchMOS transistor P2 and NchMOS transistor N2 are connected in series between the power supply terminal VCC and ground terminal GND. The PchMOS transistor P1 and a drain terminal of the NchMOS transistor N1 are connected to gate terminals of the PchMOS transistor P2 and NchMOS transistor N2. In the present example, a power supply short-circuit signal BF is output from a terminal between a drain terminal of the PchMOS transistor P2 and a drain terminal of the NchMOS transistor N2.

Figure 7B:
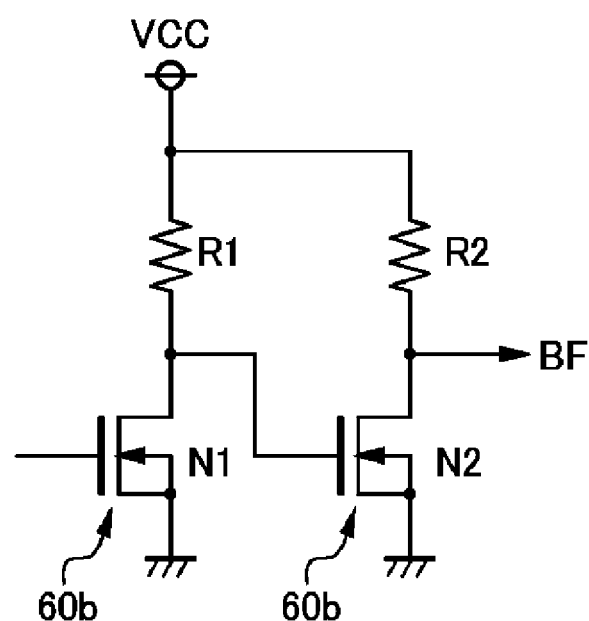
FIG. 7B illustrates an exemplary configuration of the buffer circuit 39.

FIG. 7B illustrates an exemplary configuration of the buffer circuit 39. The buffer circuit 39 in the present example includes two detection buffer transistors 60b. The buffer circuit 39 of the present example includes two resistance devices R1 and R2, and two NchMOS transistors N1 and N2 as the detection buffer transistors 60b.

The resistance R1 and NchMOS transistor N1 are connected in series between the power supply terminal VCC and ground terminal GND. Also, the resistance R2 and NchMOS transistor N2 are connected in series between the power supply terminal VCC and ground terminal GND. A terminal between the resistance R1 and a drain terminal of the NchMOS transistor N1 is connected to a gate terminal of the NchMOS transistor N2. In the present example, a power supply short-circuit signal BF is output from a terminal between the resistance R2 and a drain terminal of the NchMOS transistor N2.

Figure 7C:
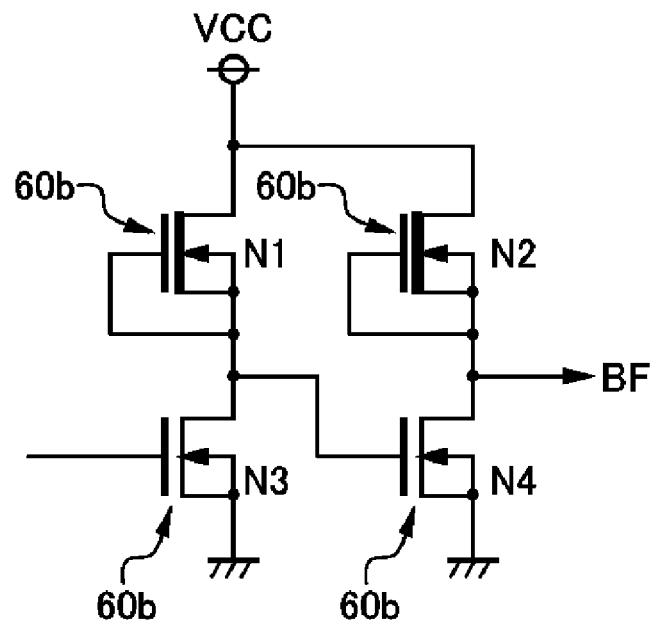
FIG. 7C illustrates an exemplary configuration of the buffer circuit 39.

FIG. 7C illustrates an exemplary configuration of the buffer circuit 39. The buffer circuit 39 of the present example includes four detection buffer transistors 60b. The buffer circuit 39 of the present example includes two Nch depletion MOS transistors N1 and N2, and two Nch MOS transistors N3 and N4, as the detection buffer transistors 60b.

The Nch depletion MOS transistor N1 and NchMOS transistor N3 are connected in in series between the power supply terminal VCC and ground terminal GND. Also, the Nch depletion MOS transistor N2 and NchMOS transistor N4 are connected in series between the power supply terminal VCC and ground terminal GND. A source terminal of the Nch depletion MOS transistor N1 and a drain terminal of the NchMOS transistor N3 are connected to a gate terminal of the NchMOS transistor N4. In the present example, a power supply short-circuit signal BF is output from a terminal between a source terminal of the Nch depletion MOS transistor N2 and a drain terminal of the NchMOS transistor N4.

Figure 7D:
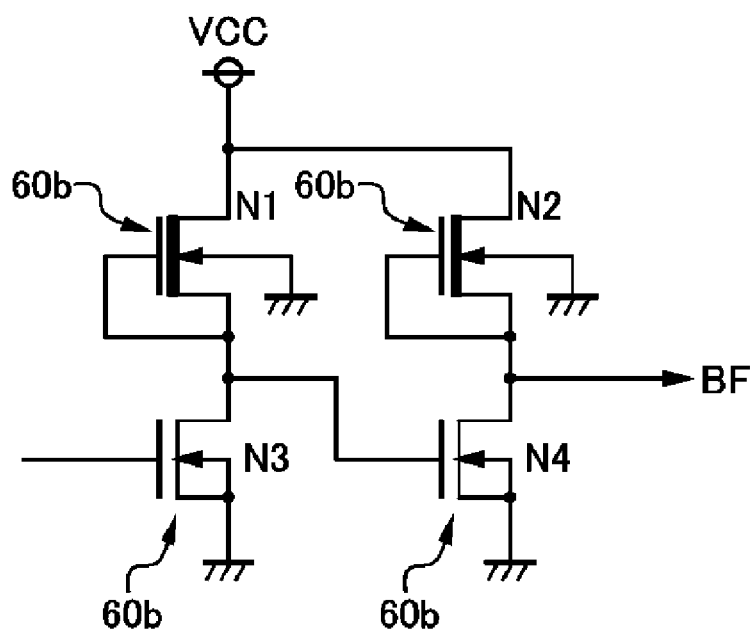
FIG. 7D illustrates an exemplary configuration of the buffer circuit 39.

FIG. 7D illustrates an exemplary configuration of the buffer circuit 39. The buffer circuit 39 of the present example includes four detection buffer transistors 60b. The buffer circuit 39 of the present example includes two Nch depletion MOS transistors N1 and N2, and two Nch MOS transistors N3 and N4, as the detection buffer transistors 60b. The Nch depletion MOS transistor N1 and NchMOS transistor N2 of the present example are different from the Nch depletion MOS transistor N1 and Nch depletion MOS transistor N2 of FIG. 7C, as their bases are connected to ground terminals GND.

As described above, the buffer circuits 39 illustrated in FIG. 7A to FIG. 7D have detection buffer transistors 60b. Since a parasitic PNP transistor is not likely to operate in the structure of the semiconductor device 100, the detection buffer transistors 60b of the buffer circuit 39 may be arranged adjacent to the resistance portion 50. Accordingly, a layout of the buffer circuit 39 can be designed freely in the semiconductor device 100.

Example 1

Figure 8:
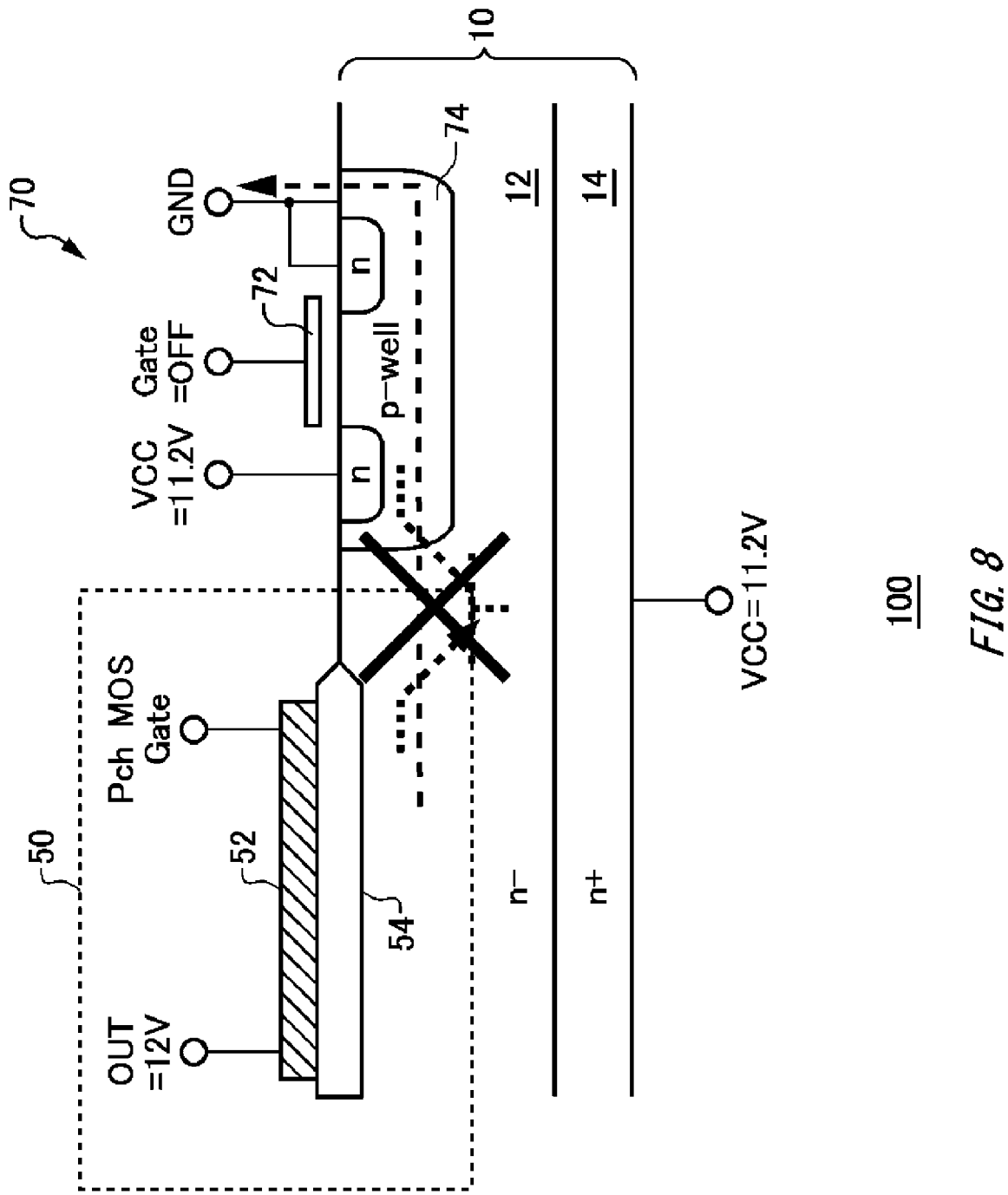
FIG. 8 illustrates an exemplary configuration of the semiconductor device 100 according to Example 1.

FIG. 8 illustrates an exemplary configuration of the semiconductor device 100 according to Example 1. A resistance portion 50 in the present example includes a polysilicon film 52 and an insulating film 54. The semiconductor device 100 of the present example includes a control transistor portion 70. The present example shows a case in which the resistance portion 50 is placed close to a well layer 74 of a transistor of the control transistor portion 70.

The control transistor portion 70 is provided on a substrate 10. Also, the control transistor portion 70 is arranged in a control protection circuit 30. The control transistor portion 70 may only need to be a transistor provided on the control protection circuit 30, and its function is not particularly limited. The transistor of the control transistor portion 70 is formed within the well layer 74 that is formed in a drift region 12. The transistor of the control transistor portion 70 of the present example is an NchMOS transistor. The well layer 74 of the present example is of the second conductivity type.

A polysilicon film 52 is connected to two terminals. The polysilicon film 52 of the present example is connected to an output terminal OUT and a gate terminal of a detection main transistor 60a. The polysilicon film 52 is an n type or a p type polysilicon film having a predetermined resistance. The polysilicon film 52 has resistance that is high enough for it to be able to serve as the resistance portion 50 to protect a diode 65. The polysilicon film 52 is formed on the substrate 10 and formed on the insulating film 54. The polysilicon film 52 may be formed in a common process of forming the other polysilicon films to be provided on the same substrate 10.

Because the polysilicon film 52 of the present example is not a dispersion layer of the second conductivity type formed by implanting ion to the substrate 10, a PNP parasitic transistor is not formed by the drift region 12 and the well layer 74 of the control transistor portion 70.

The insulating film 54 is formed on a front surface of the substrate 10. The insulating film 54 may be any insulating material such as an oxide film or a nitride film. In one example, the insulating film 54 is a LOCOS film formed by thermal oxidation treatment of the substrate 10. The insulating film 54 may be formed in a common process of forming the other LOCOS films to be provided on the same substrate 10.

The output transistor portion 20, detection transistor portion 60, and control transistor portion 70 have gate portions. For example, the output transistor portion 20 has the gate electrode 22. The detection transistor portion 60 has the gate electrode 62. The control transistor portion 70 has a gate electrode 72. In one example, at least any of the gate electrode 22, gate electrode 62, and gate electrode 72 has gate poly electrodes formed of polysilicon. In this case, dopant concentration of the polysilicon film 52 is lower than dopant concentration of the gate electrode 22, gate electrode 62, and gate electrode 72 which are formed of polysilicon. That is, the polysilicon film 52 may be a film having high resistance than those of the gate electrode 22, gate electrode 62, and gate electrode 72 which are formed of polysilicon.

As described above, the resistance portion 50 is not a dispersion layer of the second conductivity type formed by implanting ion to the substrate 10. That is, the resistance portion 50 does not configure a parasitic PNP transistor with the drift region 12 and well layer 74. Thereby, the power supply short-circuit detection circuit 38 can suppress circuit malfunction at the time of a power supply short-circuit.

Note that, although described in the present example is a case in which the resistance portion 50 is provided close to the NchMOS transistor of the control transistor portion 70, a transistor placed close to a resistance portion 50 is not particularly limited as long as it is a transistor provided on a single substrate 10 with the resistance portion 50. That is, since a parasitic PNP transistor is not configured even if the NchMOS transistor and resistance portion 50 are adjacently provided on the substrate 10, the semiconductor device 100 of the present example can suppress circuit malfunction at the time of a power supply short-circuit. Note that, the spirit of the present embodiment can be applied to a case in which a resistance portion 50 is arranged close to a transistor portion such that the resistance portion 50 configures a parasitic PNP transistor or parasitic NPN transistor.

Since a parasitic PNP transistor is not likely to operate in the structure of the semiconductor device 100 of the present example, distance from the resistance portion 50 to the well layer 74 can be close. Here, the distance between the resistance portion 50 and well layer 74 refers to the shortest distance between the polysilicon film 52 connected to the gate terminal of the detection main transistor 60a and the well layer 74. For example, the resistance portion 50 and well layer 74 are placed close to each other within a distance of 10 μm or less, or more preferably 5 μm or less. Thereby, miniaturization of the semiconductor device 100 is realized.

Also, making the resistance portion 50 and well layer 74 to be close to each other may mean that, the resistance portion 50 and well layer 74 are connected by the drift region 12, for example. That is, if the resistance portion 50 and well layer 74 are close to each other, it means no insulating structure or the other peripheral devices etc. are formed between the resistance portion 50 and well layer 74. Note that, although described herein is a case in which the resistance portion 50 and the well layer 74 of the NchMOS transistor of the control transistor portion 70 are made close to each other, it is also the same in a case in which the resistance portion 50 and the output transistor portion 20 or the well layer of the transistor of the detection transistor portion 60, which forms a parasitic transistor, are made close to each other. Also, similar concept can be applied to those configuring a parasitic PNP transistor or an NPN transistor, even if they do not have configuration equivalent to the well layer 74.

In this way, the transistor of the semiconductor device 100 of the present example can be provided adjacent to the resistance portion 50 regardless of conductivity type of the transistor. For example, in the semiconductor device 100, an NchMOS transistor can be provided close to the resistance portion 50. Accordingly, degree of freedom in the layout of the circuit in the semiconductor device 100 improves.

Example 2

Figure 9:
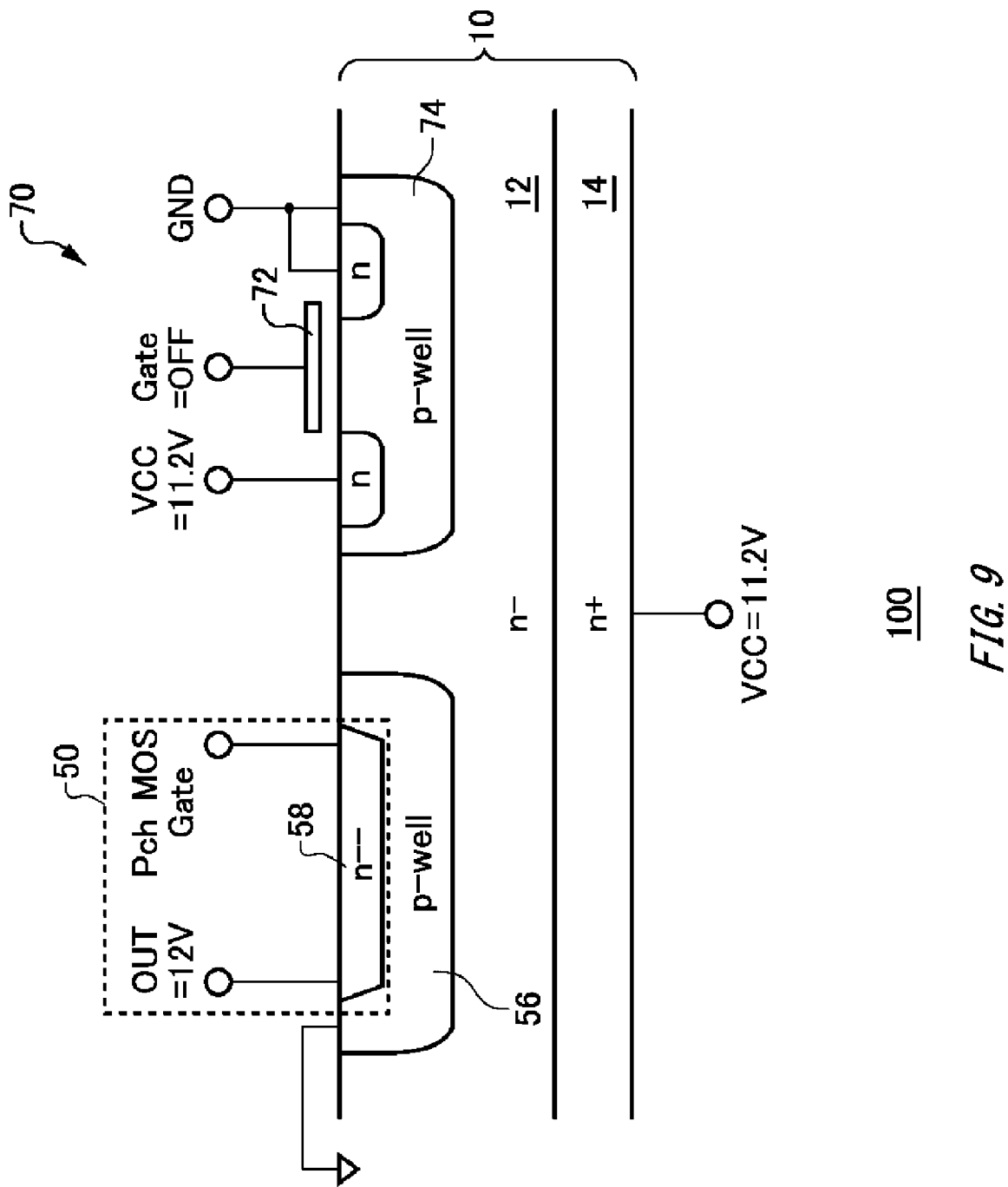
FIG. 9 illustrates an exemplary configuration of the semiconductor device 100 according to Example 2.

FIG. 9 illustrates an exemplary configuration of the semiconductor device 100 according to Example 2. A resistance portion 50 of the present example is a diffusion resistance layer 58 surrounded by a second well layer 56.

The second well layer 56 is formed on a front surface of the substrate 10. The second well layer 56 is a dispersion layer of the second conductivity type formed by implanting dopant thereto. For example, the second well layer 56 is formed by implanting ion such as boron (B) or aluminum (Al) thereto. The second well layer 56 of the present example is of p− type conductivity type. The second well layer 56 is set to a potential at equal to or less than a power supply voltage $V_{CC}$ that is set to a power supply terminal $V_{CC}$. For example, 'equal to or less than a power supply voltage $V_{CC}$' refers to the power supply voltage $V_{CC}$ or voltage of a ground terminal GND.

The diffusion resistance layer 58 is formed on the front surface of the substrate 10 within the second well layer 56. That is, the diffusion resistance layer 58 is formed being surrounded by the second well layer 56. The diffusion resistance layer 58 is the dispersion layer of the first conductivity type formed by implanting dopant thereto. For example, the diffusion resistance layer 58 is formed by implanting ion such as phosphorus (P) or arsenicum (As). Doping concentration of the diffusion resistance layer 58 is thinner than doping concentration of the drift region 12. The diffusion resistance layer 58 of the present example is n−− conductivity type. The diffusion resistance layer 58 is connected to a gate terminal of a detection main transistor 60*a*. Also, the diffusion resistance layer 58 is set to a potential of a battery terminal (12 V, for example).

Comparative Example 1

Figure 10:
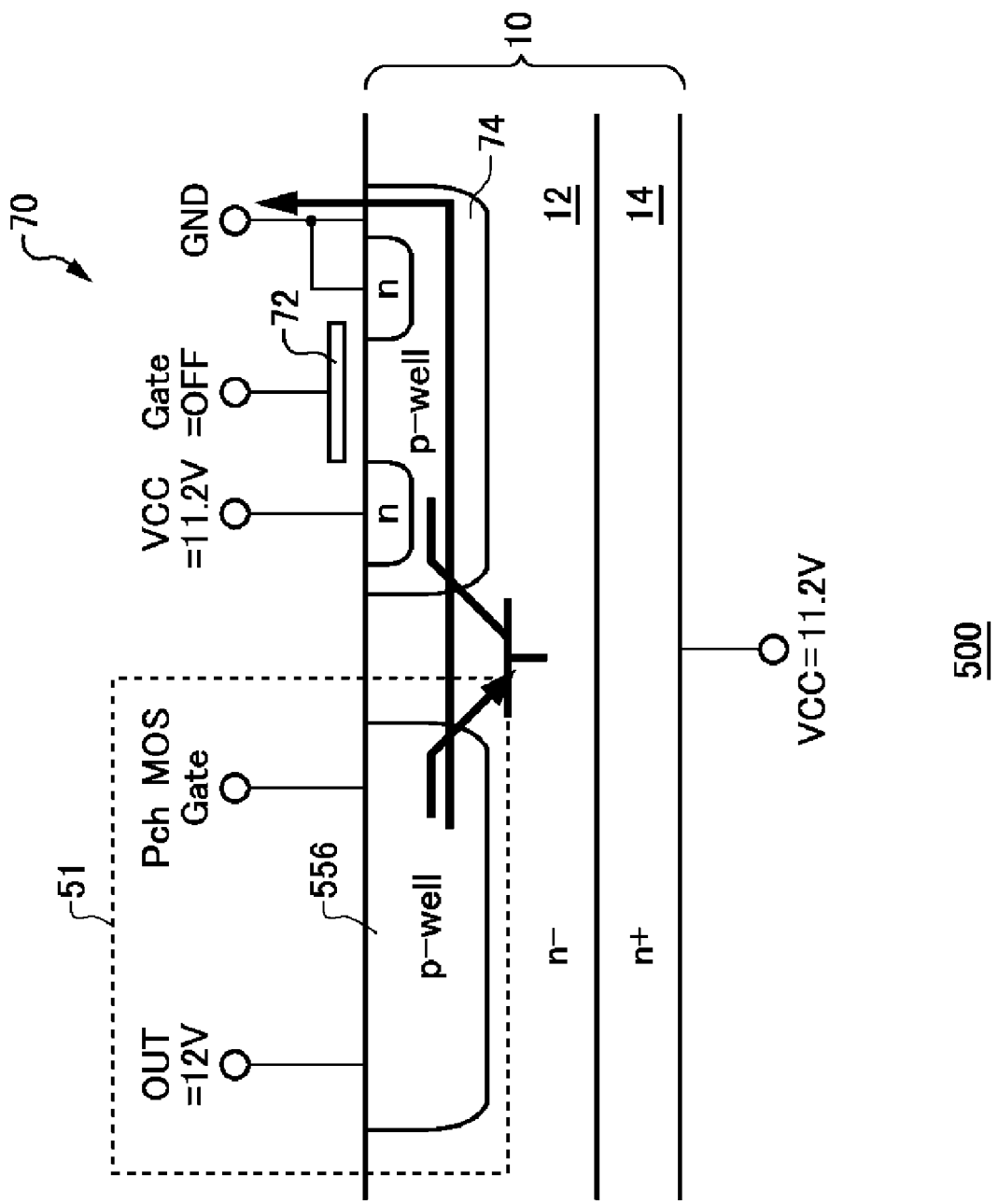
FIG. 10 illustrates configuration of a semiconductor device 500 according to Comparative Example 1.

FIG. 10 illustrates configured of a semiconductor device 500 according to Comparative Example 1. The semiconductor device 500 has a well layer 556 as a resistance portion 51, instead of a resistance portion 50 of Example, which is formed in a substrate 10.

The well layer 556 is formed on a front surface of the substrate 10. The well layer 556 is connected to an output terminal OUT and a gate terminal of a detection main transistor 60*a*. The well layer 556 is a p− type dispersion layer formed by implanting dopant thereto. Accordingly, the well layer 556 is forming a PNP parasitic transistor with an n− type drift region 12 and p− type well layer 74.

Here, if a power supply short-circuit occurs to the semiconductor device 500 of the present example, the well layer 556 is set to 12 V that is voltage of the output terminal OUT, and voltage of a power supply terminal VCC becomes 11.2 V. Also, the well layer 74 to which an NchMOS transistor of a control transistor portion 70 is formed is connected to a ground terminal GND. Accordingly, the parasitic PNP transistor is turned on, and current flows between the resistance portion 51 formed of the p well and the ground terminal GND of the NchMOS transistor of the control transistor portion 70. Thereby, the semiconductor device 500 according to Comparative Example 1 may induce malfunction at the time of a power supply short-circuit.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a control transistor portion which is provided on a substrate having a drift region of a first conductivity type, and includes a well layer of a second conductivity type;
   a detection transistor portion which is provided on the substrate, and includes a gate terminal, and detects whether or not a power supply short-circuit has occurred to the semiconductor device;
   a resistance portion provided close to the well layer of the control transistor portion in the substrate; and
   two terminals connected to the resistance portion, wherein
      a first of the two terminals of the resistance portion is connected to the gate terminal of the detection transistor portion, and is not in a region of the second conductivity type formed on the substrate,
   wherein the detection transistor portion forms a second conductivity type channel, and also has:
   a source terminal connected to a power supply terminal of the semiconductor device;
   the gate terminal connected to an output terminal of the semiconductor device via the resistance portion; and
   a drain terminal connected to a ground terminal via resistance, wherein
      the drain terminal is connected to a power supply short-circuit terminal for outputting a power supply short-circuit detection signal that indicates a power supply short-circuit state of the semiconductor device.

2. The semiconductor device according to claim 1, further comprising:
   a diode of which an anode is connected to the gate terminal of the detection transistor portion, and of which a cathode is connected to a source terminal of the detection transistor portion, wherein
      one end of the resistance portion is connected to the anode, and the other end is connected to an output terminal of the semiconductor device.

3. A semiconductor device comprising:
   a control transistor portion which is provided on a substrate having a drift region of a first conductivity type, and includes a well layer of a second conductivity type;
   a detection transistor portion which is provided on the substrate, and includes a gate terminal, and detects whether or not a power supply short-circuit has occurred to the semiconductor device;
   a resistance portion provided close to the well layer of the control transistor portion in the substrate; and
   two terminals connected to the resistance portion, wherein a first of the two terminals of the resistance portion is connected to the gate terminal of the detection transistor portion, and is not in a region of the second conductivity type formed on the substrate, wherein the resistance portion has:
    an insulating film provided on the substrate; and
    the resistance portion is formed of a polysilicon film formed on the insulating film and connected to the gate terminal of the detection transistor portion.

4. The semiconductor device according to claim 3, wherein:
    the gate terminal has a gate poly electrode formed of polysilicon; and
    a dopant concentration of the polysilicon film of the resistance portion is lower than a dopant concentration of the gate poly electrode.

5. The semiconductor device according to claim 3, wherein the resistance portion and the well layer of the control transistor portion are placed close to each other within a distance of 10 μm or less.

6. The semiconductor device according to claim 3, wherein the resistance portion is provided close to the well layer of the control transistor portion, such that the resistance portion and the well layer of the control transistor portion are connected by the drift region of the first conductivity type.

\* \* \* \* \*